United States Patent
Takeuchi et al.

(10) Patent No.: US 6,903,496 B2
(45) Date of Patent: Jun. 7, 2005

(54) PIEZOELECTRIC FILTER AND ELECTRONIC COMPONENT INCLUDING THE SAME

(75) Inventors: Masaki Takeuchi, Otsu (JP); Hajime Yamada, Otsu (JP); Hideki Kawamura, Shiga-ken (JP); Daisuke Nakamura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/446,963

(22) Filed: May 29, 2003

(65) Prior Publication Data

US 2003/0222539 A1 Dec. 4, 2003

(30) Foreign Application Priority Data

Jun. 3, 2002 (JP) ........................ 2002-161315

(51) Int. Cl.[7] ............................. H04R 17/00; H03H 9/56
(52) U.S. Cl. ........................ 310/363; 310/365
(58) Field of Search ............................. 310/324, 322, 310/328, 346, 331, 321, 311, 363–365; H04R 17/00; H03H 9/56

(56) References Cited

U.S. PATENT DOCUMENTS

| | | | |
|---|---|---|---|
| 4,456,850 A | * | 6/1984 | Inoue et al. ............... 310/324 |
| 5,894,647 A | | 4/1999 | Lakin |
| 6,339,276 B1 | * | 1/2002 | Barber et al. ............... 310/364 |
| 6,407,649 B1 | * | 6/2002 | Tikka et al. ................ 310/312 |
| 6,469,597 B2 | * | 10/2002 | Ruby et al. ................. 310/312 |
| 6,774,746 B2 | * | 8/2004 | Whatmore et al. ......... 310/312 |

FOREIGN PATENT DOCUMENTS

| | | | |
|---|---|---|---|
| JP | 58-121817 | | 7/1983 |
| JP | 58-137317 | | 8/1983 |
| JP | 2001-016867 | | 1/2001 |
| JP | 2001-308681 | | 11/2001 |
| JP | 2001308681 | * | 11/2001 ............ H03H/9/56 |

* cited by examiner

*Primary Examiner*—Darren Schuberg
*Assistant Examiner*—Karen Beth Addison
(74) *Attorney, Agent, or Firm*—Keating & Bennett, LLP

(57) ABSTRACT

A piezoelectric filter includes a piezoelectric thin film disposed on a silicon substrate, and a plurality of piezoelectric resonators each having electrodes facing each other with the piezoelectric thin film sandwiched therebetween, and each of the plurality of piezoelectric resonators has a filtering function. The electrode material of one of the piezoelectric resonators is different from the electrode material of the other piezoelectric resonators. For example, the former electrode material has a higher stiffness than the latter electrode material. The piezoelectric filter achieves high-Q resonance and improves the attenuation characteristic.

15 Claims, 6 Drawing Sheets

PIEZOELECTRIC FILTER AND ELECTRONIC COMPONENT INCLUDING THE SAME

BACKGROUND OF THE INVENTION

1. Field of the Invention

The present invention relates to a piezoelectric filter with low insertion loss for use in a radio-frequency (RF, particularly, GHz or higher-frequency) stage in a communication device such as a cellular telephone, and also relates to an electronic component including such a piezoelectric filter, such as a duplexer.

2. Description of the Related Art

Recently, there have been developed radio-frequency (RF, particularly, GHz or higher-frequency) stage filters for use in communication devices such as cellular telephones, which use a piezoelectric resonator having desirable characteristics. Specifically, such a resonator is compact and lightweight, and has high resistance to vibration or shock, as well as high reliability with less product variation. In addition, the resonator is free from circuit regulation, thus allowing for automation and simplification of mounting, and can be easily manufactured even when it is designed for the high-frequency environment.

Such a piezoelectric resonator may have electrodes disposed on both surfaces of a piezoelectric substrate, and may use thickness longitudinal vibration or thickness shear vibration of the piezoelectric substrate between the electrodes. The resonant frequency of the piezoelectric resonator using thickness longitudinal vibration of the piezoelectric substrate is inversely proportional to the thickness of the piezoelectric substrate. In a very high frequency region, therefore, the piezoelectric substrate must be extremely thin.

In an approach to thin a piezoelectric substrate itself, however, there is a high-frequency limit of several hundred megahertz in practice, in a fundamental mode, due to limitations on mechanical strength or handling. In order to solve such a high-frequency limitation problem, a piezoelectric thin film resonator used as a filter or resonator is described in, for example, Japanese Unexamined Patent Application Publication No. 2001-168674 published on Jun. 22, 2001.

In this piezoelectric thin film resonator, a thin film supporting portion can be made thin using micromachining technology, and a piezoelectric thin film can also be made thin by a technique such as sputtering. Therefore, the high-frequency characteristic of the piezoelectric thin film resonator can be extended to as high as several hundred megahertz to several thousand megahertz.

In order to improve the resonant-frequency temperature characteristic, a resonator combined with a $SiO_2$ thin film having a positive resonant-frequency temperature coefficient is described in Japanese Unexamined Patent Application Publication No. 58-121817 published on Jul. 20, 1983 and Japanese Unexamined Patent Application Publication No. 58-137317 published on Aug. 15, 1983.

Also, a piezoelectric resonator including a bottom electrode, a piezoelectric film made of aluminum nitride (AlN), and a top electrode, wherein the electrode material is molybdenum (Mo) having a low thermo-elastic loss in order to increase the Q factor of the piezoelectric resonator is described in Japanese Unexamined Patent Application Publication No. 2000-69594 published on Mar. 3, 2000.

When any of the above-mentioned piezoelectric resonators is used to form a ladder filter with low insertion loss, the resonant frequency of a series piezoelectric resonator and the resonant frequency of a parallel piezoelectric resonator must be shifted substantially by a frequency corresponding to the passband of each other. In general, the frequency of the parallel piezoelectric resonator must be lowered.

One frequency shifting method, as described in, for example, Japanese Unexamined Patent Application Publication No. 58-121815, is to deposit a layer on the backside of a diaphragm using a technique such as evaporation so that this mass addition effect is utilized for frequency shifting. Another method is to add a layer on the top surface of a specific piezoelectric resonator and to remove a portion of the layer so as to shift the resonant frequency to the desired resonant frequency, as described in the U.S. Pat. No. 5,894,647 issued on Apr. 20, 1999.

In a filter formed of a plurality of piezoelectric resonators having different frequency characteristics (passbands), such as a ladder filter or a multimode filter, the thicknesses of vibrating portions each being disposed of the bottom electrode, the piezoelectric thin film, the top electrode, and so on differ from each other, resulting in different frequency characteristics (passbands).

Although the bottom electrodes, the piezoelectric thin films, or insulating films which may be formed beneath the bottom electrodes in some cases can have different thicknesses, the number of production steps and the production costs increase.

Accordingly, there has been proposed an approach in which the thicknesses of the bottom electrodes, the piezoelectric thin films, or the insulating films are common to some extent and the top electrodes, which are made of the same material, have different thicknesses from one piezoelectric resonator to another, resulting in different frequency characteristics (passbands).

However, the piezoelectric resonators require desirable film ratios depending upon the frequency characteristics (passbands). If one of the piezoelectric resonators having different frequency characteristics (passbands) includes a top electrode fabricated with the optimum film configuration, the other (or another) piezoelectric resonator cannot accomplish the desirable film configuration.

SUMMARY OF THE INVENTION

In order to overcome the problems described above, preferred embodiments of the present invention provide a piezoelectric filter including at least one piezoelectric thin film disposed on a substrate, and a plurality of piezoelectric resonators each having a top electrode and a bottom electrode facing each other with the piezoelectric thin film sandwiched therebetween, and each of the plurality of piezoelectric resonators has a filtering function. The electrode material of at least one of the piezoelectric resonators is different from the electrode material of the other piezoelectric resonators.

In the piezoelectric filter, preferably, the electrode material of the top electrode of the at least one piezoelectric resonator is different from the electrode material of the other piezoelectric resonators.

In the piezoelectric filter, preferably, the stiffness, along the vibration direction of a vibration wave, of the electrode material of the at least one piezoelectric resonator is different from that of the electrode material of the other piezoelectric resonators.

With this structure, the electrode material of at least one piezoelectric resonator (particularly the electrode material of the top electrode of this piezoelectric resonator) is different from the electrode material of other piezoelectric resonators, thereby separately adjusting the resonant frequencies of the piezoelectric resonators with the desirable film configurations.

In this structure, for example, the different electrode materials have different stiffnesses. This allows the Q factors of the piezoelectric resonators to be separately adjusted without any additional layer or any new production step, resulting in higher Q factors.

With this structure, therefore, the filter can effectively utilize the filtering ability without a reduction in Q factor or without any additional production step, and can also achieve low insertion loss and prevent deterioration of attenuation characteristics on the low frequency region in the passband.

In the piezoelectric filter, preferably, the substrate includes an opening or a recess, and a vibrating portion of the piezoelectric thin film is located above the opening or recess of the substrate.

Since the vibrating portion of the piezoelectric thin film is located above the opening or recess of the substrate, an obstruction of vibration of the piezoelectric thin film can be prevented to increase the frequency and the Q factor. With this structure, therefore, the filter achieves low insertion loss and also significantly improves the attenuation characteristic on the low frequency region in the passband.

In the piezoelectric filter, the piezoelectric resonators may be arranged to define a ladder filter.

In this piezoelectric filter, preferably, the stiffness, along the vibration direction of a vibration wave, of the electrode material of the parallel piezoelectric resonator is different from that of the electrode material of the series piezoelectric resonator.

In the piezoelectric filter, preferably, a plurality of insulating films having different temperature coefficients are disposed on one surface of the piezoelectric thin film. With the temperature characteristics of the piezoelectric thin film or the insulating films, the overall piezoelectric filter has a temperature characteristic close to zero. Consequently, the temperature characteristic and the filter characteristic of the filter are improved.

In another preferred embodiment of the present invention, an electronic component includes the above-described piezoelectric filter according to other preferred embodiments of the present invention.

Therefore, an electronic component including the piezoelectric filter greatly improves the filter characteristic and can be implemented as, for example, a duplexer having a superior separation capability.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A ladder filter as a piezoelectric filter according to a preferred embodiment of the present invention, and a duplexer as an electronic component having the ladder filter according to a preferred embodiment of the present invention are described below with reference to FIGS. 1 through 6.

Figure 1:
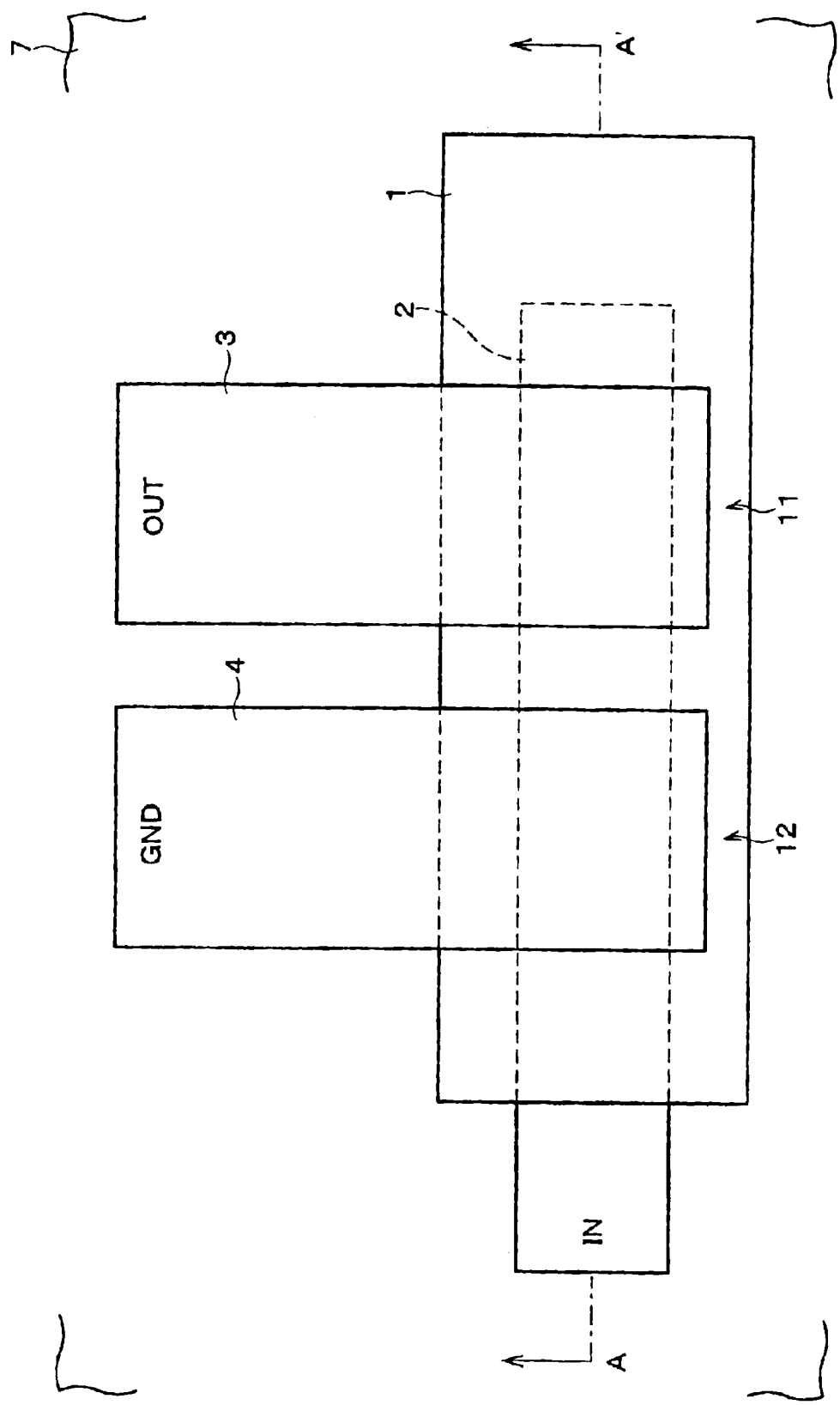
FIG. 1 is a plan view showing the main portion of a ladder filter according to a preferred embodiment of the present invention.
Figure 2:
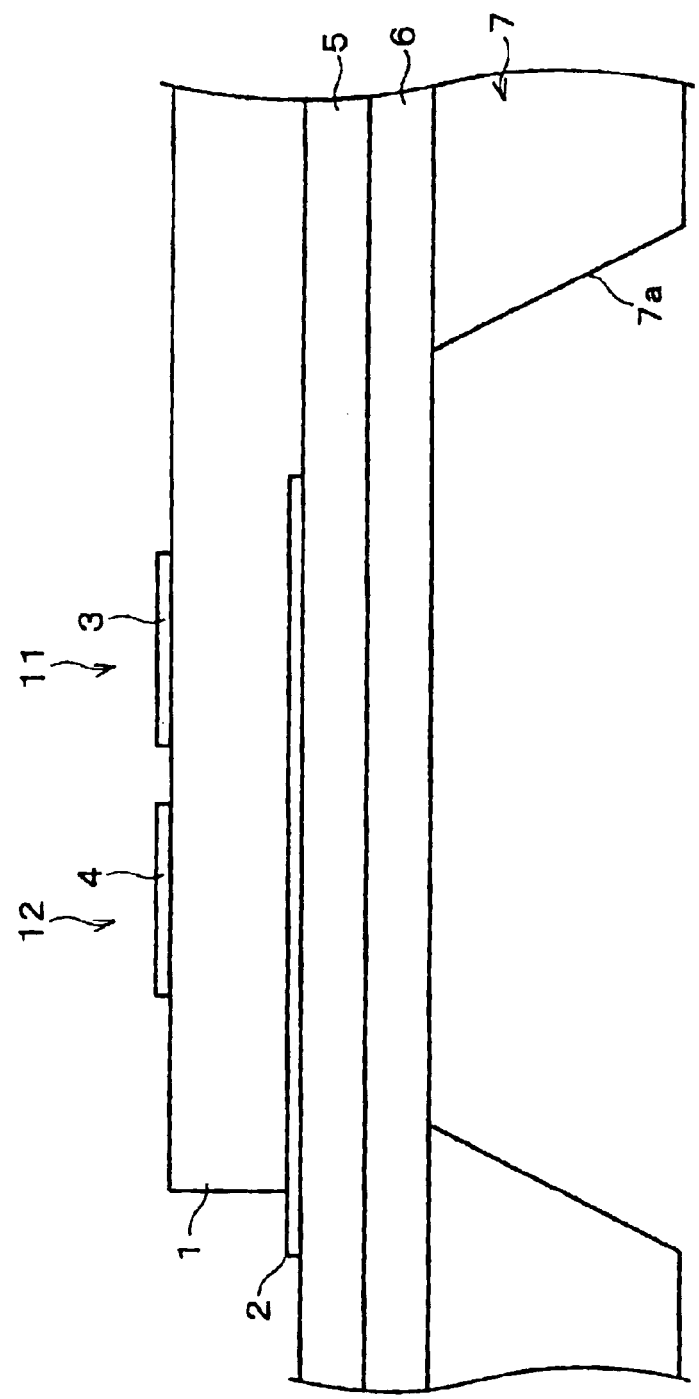
FIG. 2 is a cross-sectional view of the ladder filter shown in FIG. 1, taken along a line A–A'.

As shown in FIGS. 1 and 2, the ladder filter includes a piezoelectric thin film 1 preferably made of ZnO as the main ingredient, a bottom electrode 2 preferably made of Al or other suitable material, and top electrodes 3 and 4 facing the bottom electrode 2 with the piezoelectric thin film 1 sandwiched therebetween. The bottom electrode 2 and the top electrodes 3 and 4 are preferably shaped into strips, and the longitudinal direction of the bottom electrode 2 is substantially perpendicular to the longitudinal direction of the top electrodes 3 and 4. The top electrodes 3 and 4 are preferably arranged side-by-side so as to be substantially parallel to each other.

The piezoelectric thin film 1, the bottom electrode 2, and the top electrode 3 define a piezoelectric thin film resonator, and the piezoelectric thin film 1, the bottom electrode 2, and the top electrode 4 define another piezoelectric thin film resonator.

Figure 3:
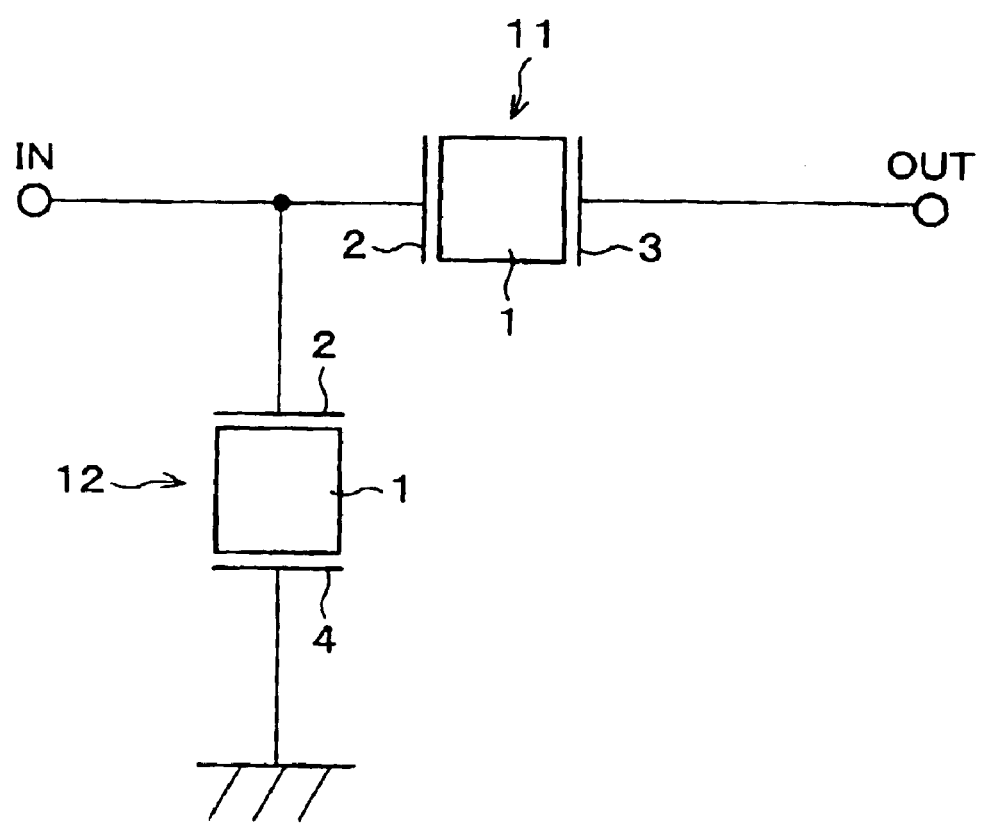
FIG. 3 is a circuit block diagram of the ladder filter of FIG. 1.
Figure 4A:
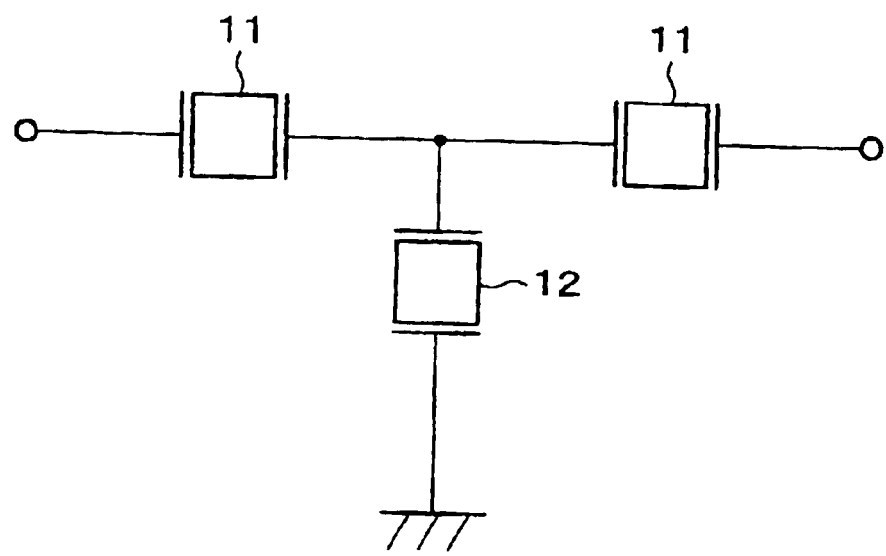
FIGS. 4A and 4B are circuit block diagrams of a T filter and a pie filter according to modifications of the ladder filter, respectively.
Figure 4B:
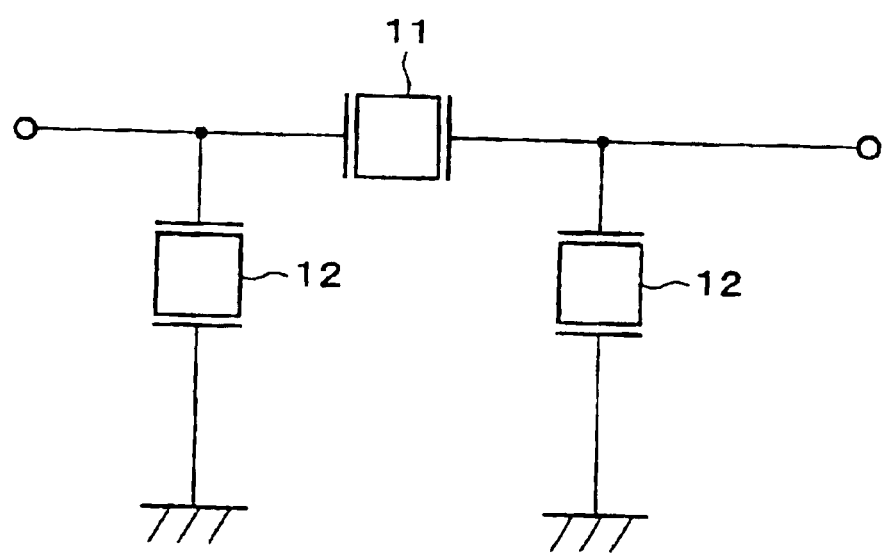

For example, the top electrode 4 is grounded (coupled to a ground GND), and the bottom electrode 2 and the top electrode 3 are connected at the input side and the output side, respectively, thereby providing a substantially L-shaped ladder filter including a series piezoelectric resonator 11 having the top electrode 3 and a parallel piezoelectric resonator 12 having the top electrode 4, as shown in FIG. 3.

This ladder filter is designed such that the antiresonant frequency of the series piezoelectric resonator 11 substantially coincides with the resonant frequency of the parallel piezoelectric resonator 12 and the resonant frequency of the parallel piezoelectric resonator 12 is lower than the resonant frequency of the series piezoelectric resonator 11.

In the ladder filter of such a structure, a passband formed between the antiresonant frequency of the parallel piezoelectric resonator 12 and the resonant frequency of the series piezoelectric resonator 11, which correspond to attenuation poles, can be highly selectable. Thus, the ladder filter has stopbands including the attenuation poles at both sides of the passband.

In the ladder filter, the top electrodes 3 and 4 are made of different materials from each other. For example, the stiffness, along the vibration direction of a vibration wave of the piezoelectric thin film 1, of the electrode material of at least one piezoelectric resonator is different from that of the electrode material of another piezoelectric resonator. As a specific example, the electrode materials of the top electrodes 3 and 4 are Al and Ni, respectively, and the stiffness of the top electrode 4 is higher than that of the top electrode 3.

The electrode material of the top electrode 4 may be a permanent elastic material such as Ta, Nb, Mo, Pt, W, stainless alloy, Al alloy, an additive (such as Cu, Mg, Si, or Zn) to Al, or elinvar. Elinvar is a Fe—Ni—Cr alloy having a coefficient of expansion that can be controlled by heat treatment in the vicinity of the magnetic phase transition point. Preferably, the top electrode 4 is made of a material having a stiffness that is higher than or equal to approximately $2.0 \times 10^{11}$ Pa in the direction parallel to the excitation direction of the vibration wave.

The bottom electrode 2 of the parallel piezoelectric resonator 12 made of any of the above-listed materials can achieve equivalent advantages; however, preferably, the misfit between the lattice constant of the piezoelectric thin film 1 (in this case, ZnO film) in the direction vertical to the direction in which the vibration wave propagates and lattice constant of the electrode material in the direction vertical to the direction in which the vibration wave propagates is about 5% or lower. The ladder filter according to the present invention is not limited to the substantially L-shaped ladder filter, and other types of ladder filter such as a T filter and a pie filter shown in FIGS. 4A and 4B, respectively, and any modification thereof may be used.

As shown in FIG. 2, preferably, the ladder filter further includes an alumina (first insulating) film 5, a silicon dioxide (second insulating) film 6, and a silicon substrate 7 so as to support the bottom electrode 2 or the piezoelectric thin film 1. Preferably, a hollow portion 7a is formed in the silicon substrate 7 at the position corresponding to a vibrating portion formed of the piezoelectric thin film 1, the bottom electrode 2, and each of the top electrodes 3 and 4, thereby providing a diaphragm structure which prevents an obstruction of vibration of the vibrating portions.

A production method of the ladder filter is described below with reference to FIG. 2. The silicon dioxide film 6 is deposited on the silicon substrate 7 preferably by a deposition method such as thermal oxidation or sputtering, on which the alumina (aluminum oxide) film 5, followed by the bottom electrode 2 made of Al, the piezoelectric thin film 1 made of ZnO as the main ingredient, and the top electrodes 3 and 4 made of Al and Ni, respectively, is formed preferably by a deposition method such as electronic beam evaporation or sputtering.

A portion of the silicon substrate 7 beneath the vibrating portions (electrode facing portions) is removed preferably by a method such as anisotropic etching or RIE (Reactive Ion Etching) to form the hollow portion 7a as a through-hole interfacing with the silicon dioxide film 6 so as to form the vibrating portions into a diaphragm.

In this diaphragm structure, the silicon dioxide film 6 has a positive resonant-frequency temperature coefficient and generates compressive stress, while the alumina film 5 has a negative resonant-frequency temperature coefficient and generates tensile stress. The piezoelectric thin film 1 made of ZnO as the main ingredient has a negative resonant-frequency temperature coefficient and generates compressive stress.

With respect to each of the series piezoelectric resonator 11 and the parallel piezoelectric resonator 12, the total thickness of the silicon dioxide film 6, the alumina film 5, the bottom electrode 2, the piezoelectric thin film 1, and each of the top electrodes 3 and 4 can be set to, for example, about 3 $\mu$m, and the area of the diaphragm (the vibrating portion) can be set to, for example, about 600 $\mu$m×600 $\mu$m.

Preferably, the thickness of the silicon dioxide film 6, the thickness of the alumina film 5, the area and thickness of the bottom electrode 2, the thickness of the piezoelectric thin film 1, and the area and thickness of each of the top electrodes 3 and 4 are set so that the vibration mode of the series piezoelectric resonator 11 and the parallel piezoelectric resonator 12 is a second-order mode.

In the ladder filter, the total thickness of the silicon dioxide film 6 and the alumina film 5 and the total thickness of the piezoelectric thin film 1, the bottom electrode 2, and each of the top electrodes 3 and 4 are preferably set so that the filter can be resonated at a half-wave length of the desired resonant frequency. In other words, the thickness of the bottom electrode 2 and at least one of the top electrodes 3 and 4 is set according to the resonant frequency. This ensures that the vibration mode of the ladder filter becomes a second-order mode.

In addition, in the ladder filter, preferably, the piezoelectric resonator including the bottom electrode 2, the piezoelectric thin film 1, and each of the top electrodes 3 and 4 is an energy trap resonator. This prevents leakage of vibration energy into the silicon substrate 7 along the diaphragm, thereby generating high-Q resonance.

In the ladder filter, therefore, the silicon dioxide film 6 and the alumina film 5, which are insulating films (supporting films), can be thin, thus achieving a piezoelectric thin film resonator operating at a frequency as high as or higher than 100 MHz on a fundamental or low-order (for example, second-order) overtone.

In the ladder filter, furthermore, the temperature characteristic or internal stress can be cancelled in the films, thus preventing an influence caused by a temperature change or internal stress. Therefore, the temperature coefficient of the resonant frequency (ppm/° C.) for the ladder filter can be easily set to substantially zero.

Since each of the piezoelectric resonators preferably has a diaphragm dimension as small as several hundred $\mu$m or lower, and the production process thereof is compatible with that of a semiconductor integrated circuit, the piezoelectric resonators can be built into the integrated circuit. Furthermore, the piezoelectric resonators do not require sub-micron patterning even at a frequency of several gigahertz as is required for surface acoustic wave (SAW) devices, and can therefore be produced in an easy and simple way.

In the ladder filter, therefore, the top electrode 4 of the parallel piezoelectric resonator 12 has a higher stiffness than the top electrode 3 of the series piezoelectric resonator 11, thus increasing the Q factor and the electromechanical coupling coefficient ($k^2$) of the parallel piezoelectric resonator 12.

Table 1 shows characteristics of the piezoelectric resonator when the top electrode 4 is made of various materials. As is apparent from Table 1, the Q factor and the $k^2$ are higher when the top electrode 4 is made of Mo, Ni, Nb, or Ta having higher stiffness than when made of Al having low stiffness. This is because a resonator having a high stiffness electrode material is liable to vibrate and therefore provides low vibration energy loss.

TABLE 1

|  | Mo | Ni | Nb | Ta | Al |
| --- | --- | --- | --- | --- | --- |
| Density (g/cm³) | 10.2 | 8.9 | 8.57 | 16.6 | 2.69 |
| Stiffness $C_{11}^D$ | 4.63 | 2.51 | 2.46 | 2.61 | 1.07 |
| Thickness ($\mu$m) | 0.11 | 0.12 | 0.12 | 0.065 | 0.34 |
| Resonant Frequency (MHz) | 1830 | 1833 | 1837 | 1834 | 1840 |
| Q | 2032 | 2037 | 2041 | 2037 | 1320 |
| $k^2$ (%) | 3.87 | 3.86 | 3.86 | 3.86 | 3.81 |

In Table 1, the unit of the stiffness $C_{11}^D$ is "$\times 10^{11}$ Pa", and the resonant frequency is set to a range between 1800 MHz and 2000 MHz.

The thickness of the top electrode 4 is shown in Table 1. The thicknesses of the other films are as follows: the piezoelectric thin film 1, about 1.25 μm; the bottom electrode 2, about 0.18 μm; the alumina film 5, about 0.45 μm; and the silicon dioxide film 6, about 1.2 μm.

In the ladder filter, the electrode materials of the top electrodes 3 and 4 differ from each other. Thus, after forming the top electrode 3 of the series piezoelectric resonator 11, the electrode material and thickness of the top electrode 4 of the parallel piezoelectric resonator 12 can be adjusted according to the characteristic of the series piezoelectric resonator 11. More parameters for defining the filter characteristic can be used, thus increasing the design flexibility.

Furthermore, the ladder filter includes the high-Q parallel piezoelectric resonator 12 and therefore achieves higher ladder filter characteristics such as lower insertion loss and a steeper attenuation characteristic on the low frequency region in the passband.

In the foregoing description, the present invention is applied to a ladder filter, by way of example; however, the present invention is also applicable to any piezoelectric filter having a plurality of electrodes. One piezoelectric filter having such a structure is, for example, a multimode filter. By adjusting the size or mass of each electrode or the distance between the electrodes, the multimode filter is able to convert an unbalanced signal into a balanced signal and output it to the outside, or to, reversely, convert a balanced signal into an unbalanced signal and output it to the outside.

Such a multimode filter having a balance-to-unbalance conversion mechanism and the above-described ladder filter with low insertion loss according to preferred embodiments of the present invention are combined to accomplish both the desirable filter characteristics and the balance-to-unbalance conversion function.

Although a ladder filter including a single piezoelectric thin film has been described, the present invention may be applicable to a filter having electrodes disposed on separate piezoelectric thin films. A preferable combination of electrode materials of the top electrodes 3 and 4 is aluminum (Al) for the top electrode 3 and nickel (Ni) or platinum (Pt) for the top electrode 4, or nickel for the top electrode 3 and platinum for the top electrode 4.

The Young's moduli of Platinum, nickel, and aluminum are about 168 GPa, about 219.2 GPa, and about 70.3 GPa, respectively. In general, the stiffness along the vibration direction has positive correlation with the Young's modulus. Therefore, platinum has a higher stiffness along the vibration direction than aluminum.

Figure 5:
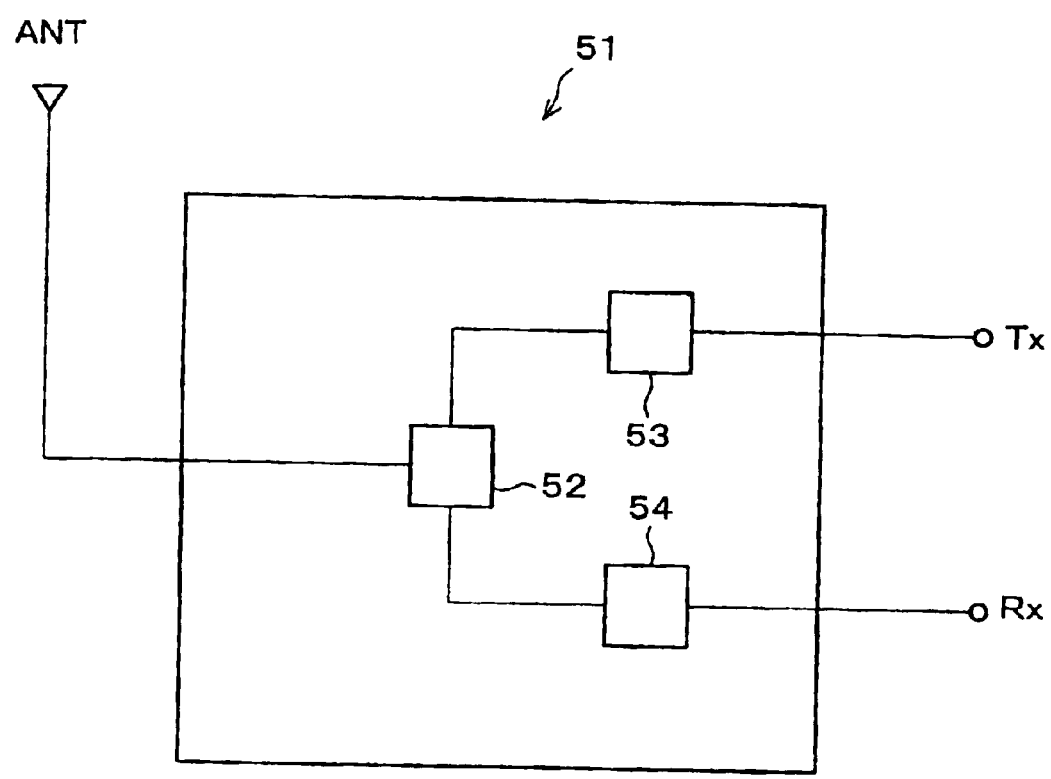
FIG. 5 is a circuit block diagram of a duplexer according to preferred embodiments of the present invention.

A duplexer (DPX) 51 as an electronic component according to another preferred embodiment of the present invention is described below with reference to FIG. 5. The duplexer 51 includes a matching circuit 52 connected with an antenna (ANT), a transmission filter 53 connected between the matching circuit 52 and a transmission terminal (Tx), and a reception filter 54 connected between the matching circuit 52 and a reception terminal (Rx).

The transmission filter 53 and the reception filter 54 are designed so as to have different passbands.

At least one of the transmission filter 53 and the reception filter 54 is preferably formed of the ladder filter according to the above-described preferred embodiment of the present invention, thereby achieving a duplexer having a steep attenuation characteristic and high filter characteristics. The term "steep attenuation characteristic" means a small frequency interval required for reducing from the upper and lower passband limits to a predetermined amount of attenuation.

As described above, the piezoelectric filter of preferred embodiments of the present invention can have a balance-to-unbalance conversion mechanism, and is readily applicable to a duplexer. The terminal of the ladder filter is connected to the antenna and the terminal of the multimode filter having the function of converting an unbalanced output to a balanced output is connected to an internal circuit such as an IC, thereby achieving a duplexer without needing to add any additional element or component.

The filter used in this duplexer has low insertion loss, and the duplexer can also provide low insertion loss. Furthermore, a steep attenuation characteristic is exhibited on the low frequency region in the passband of the filter, and a steeper attenuation characteristic can also be exhibited on the low frequency region in the passband of the transmission filter 53 and/or the reception filter 54 in the duplexer.

Figure 6:
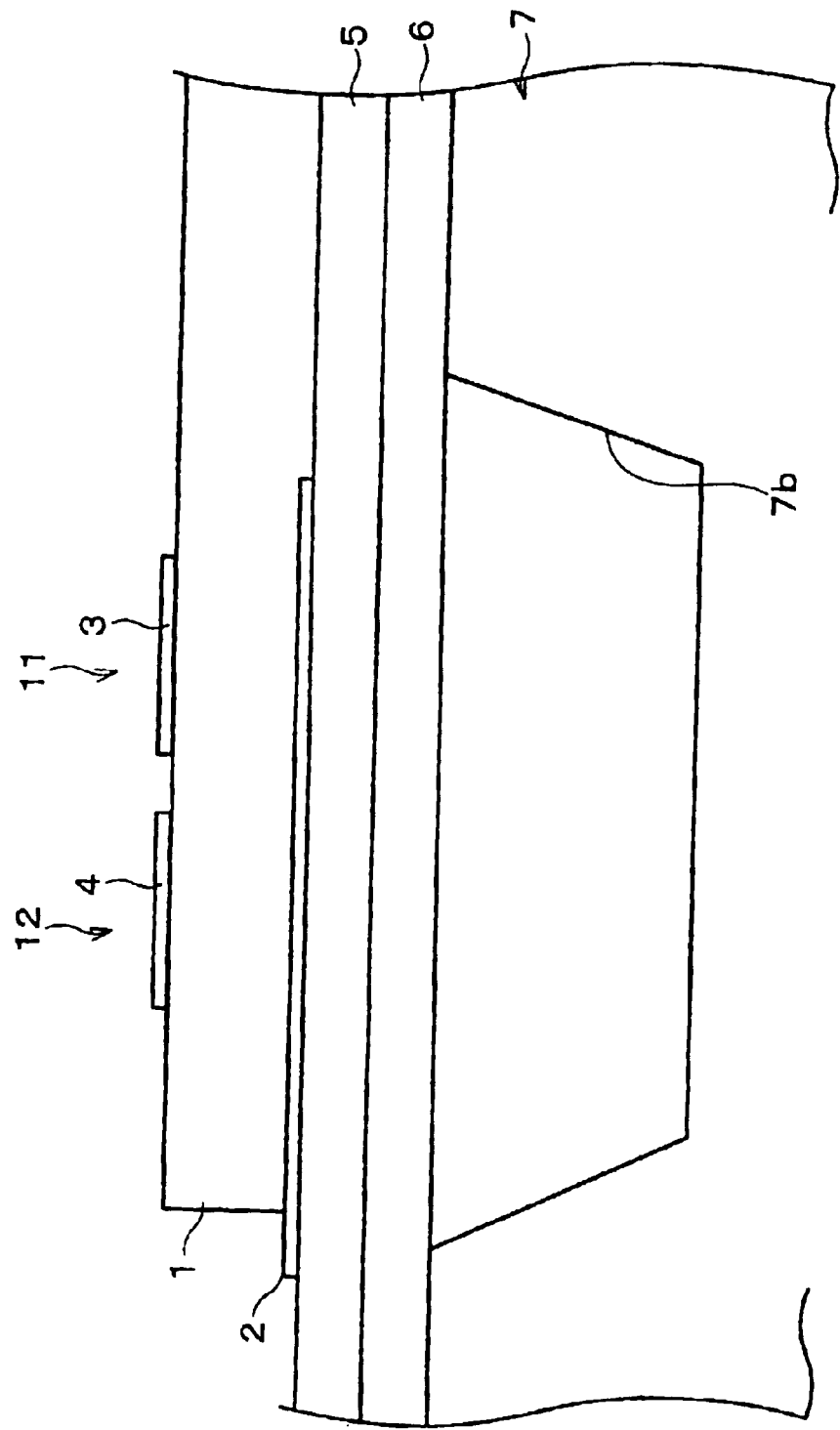
FIG. 6 is a cross-sectional view of a modification of the ladder filter shown in FIG. 1.

Although the ladder filter has been discussed in the context of a diaphragm interfacing the hollow portion 7a, the present invention is not limited to this diaphragm. Any diaphragm which is not a solid member that reduces the Q factor of the vibrating portions and which interfaces a gas such as air may be used, and, as shown in FIG. 6, a recess 7b may be formed in the silicon substrate 7 in place of the hollow portion 7a. Alternately, the diaphragm may interface a gap formed between this diaphragm and the silicon substrate 7 in place of the hollow portion 7a. Otherwise, the piezoelectric resonator may be a cantilever piezoelectric resonator or may overhang.

Each of the series piezoelectric resonator 11 and the parallel piezoelectric resonator 12 is preferably formed of electrodes (made of Ni, Al, or other suitable material), a piezoelectric thin film (such as a ZnO film), and a diaphragm layer (such as an alumina film or a silicon dioxide film), and preferably vibrates in a thickness longitudinal vibration mode. However, the present invention is not limited thereto. The piezoelectric thin film may be made of AlN, PZT, CdS, or other suitable material, and the diaphragm layer may be made of SiN or other suitable material. The resonators may vibrate in a thickness shear vibration mode, an extensional vibration mode, or a flexure vibration mode.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric filter comprising:

a substrate;

at least one piezoelectric thin film disposed on the substrate; and a plurality of piezoelectric resonators each having a top electrode and a bottom electrode facing each other with the piezoelectric thin film sandwiched therebetween, each resonator having a filtering function;

wherein at least one of the piezoelectric resonators has an electrode material that is different from an electrode material of the other piezoelectric resonators.

2. A piezoelectric filter according to claim 1, wherein the electrode material of the top electrode of the at least one piezoelectric resonator is different from the electrode material of the other piezoelectric resonators.

3. A piezoelectric filter according to claim 1, wherein the electrode material of the at least one piezoelectric resonator and the electrode material of the other piezoelectric resonators have different stiffnesses along the vibration direction of a vibration wave.

4. A piezoelectric filter according to claim 1, wherein the substrate includes an opening or a recess, and a vibration portion of the piezoelectric thin film is located above the opening or recess of the substrate.

5. A piezoelectric filter according to claim 1, wherein the plurality of piezoelectric resonators are arranged so as to define a ladder filter.

6. A piezoelectric filter according to claim 5, wherein the ladder filter includes a parallel piezoelectric resonator and a series piezoelectric resonator, and the electrode material of the parallel piezoelectric resonator and the electrode material of the series piezoelectric resonator have different stiffnesses along the vibration direction of a vibration wave.

7. A piezoelectric filter according to claim 1, wherein a plurality of insulating films having different temperature coefficients are disposed on one surface of the piezoelectric thin film.

8. A piezoelectric filter according to claim 1, wherein the piezoelectric thin film is made of Zn.

9. A piezoelectric filter according to claim 1, wherein the bottom electrode is made of Al.

10. A piezoelectric filter according to claim 1, wherein the top and bottom electrodes are strip shaped.

11. A piezoelectric filter according to claim 1, further comprising a pair of top electrodes disposed side by side.

12. A piezoelectric filter according to claim 1, wherein the piezoelectric filter comprises a substantially L-shaped ladder filter including a series piezoelectric resonator and a parallel piezoelectric resonator.

13. A piezoelectric filter according to claim 12, wherein the top electrode is made of one of Ta, Nb, Mo, Pt, W, stainless alloy, Al alloy and elinvar.

14. A piezoelectric filter according to claim 1, further including insulating films made of a silicon dioxide film and an alumina film.

15. An electronic component comprising the piezoelectric filter according to claim 1.

* * * * *

UNITED STATES PATENT AND TRADEMARK OFFICE
CERTIFICATE OF CORRECTION

PATENT NO. : 6,903,496 B2
DATED : June 7, 2005
INVENTOR(S) : Masaki Takeuchi et al.

It is certified that error appears in the above-identified patent and that said Letters Patent is hereby corrected as shown below:

<u>Title page,</u>
Item [75], Inventors, should read -- Masaki Takeuchi, Otsu (JP); Hajime Yamada, Otsu (JP); Hideki Kawamura, Shiga-ken (JP); Daisuke Nakamura, Shiga-ken (JP); Yukio Yoshino, Shiga-ken (JP) --.

Signed and Sealed this

Sixth Day of September, 2005

JON W. DUDAS
*Director of the United States Patent and Trademark Office*